(12) United States Patent
Mayfield

(10) Patent No.: US 6,879,232 B2
(45) Date of Patent: Apr. 12, 2005

(54) WIDE RATIO AUTOTRANSFORMER-TYPE CURRENT RANGING

(75) Inventor: Glenn A. Mayfield, West Lafayette, IN (US)

(73) Assignee: Radian Research, Inc., Lafayette, IN (US)

(*) Notice: Subject to any disclaimer, the term of this patent is extended or adjusted under 35 U.S.C. 154(b) by 159 days.

(21) Appl. No.: 10/380,397

(22) PCT Filed: Sep. 11, 2001

(86) PCT No.: PCT/US01/42116
§ 371 (c)(1),
(2), (4) Date: Mar. 12, 2003

(87) PCT Pub. No.: WO02/23301
PCT Pub. Date: Mar. 21, 2002

(65) Prior Publication Data
US 2003/0151482 A1 Aug. 14, 2003

Related U.S. Application Data

(60) Provisional application No. 60/232,719, filed on Sep. 15, 2000.

(51) Int. Cl.⁷ .............................................. H01F 30/14
(52) U.S. Cl. ........................................... 336/10; 336/12
(58) Field of Search ................................ 323/247, 255, 323/282, 355, 364; 330/254, 253, 283; 336/12, 10

(56) References Cited

U.S. PATENT DOCUMENTS

| | | | | |
|---|---|---|---|---|
| 3,814,866 A | * | 6/1974 | Japenga | 340/425.1 |
| 3,952,256 A | * | 4/1976 | Kosinski et al. | 330/276 |
| 4,107,620 A | * | 8/1978 | Birman et al. | 330/265 |
| 5,054,076 A | * | 10/1991 | Lowell | 381/109 |
| 6,087,738 A | * | 7/2000 | Hammond | 307/17 |
| 6,348,782 B1 | * | 2/2002 | Oughton et al. | 323/284 |
| 6,414,412 B1 | * | 7/2002 | Hao | 310/200 |
| 6,417,651 B1 | * | 7/2002 | Kronberg | 323/255 |

* cited by examiner

Primary Examiner—Anh Mai
(74) Attorney, Agent, or Firm—Barnes & Thornburg

(57) ABSTRACT

A transformer includes taps by which electrical contact can be made to winding sections of the transformer at locations along its length between its end terminals. A first switch permits contact to be made selectively to a selected one of the taps. An amplifier has an inverting input terminal, a non-inverting input terminal and an output terminal. The output terminal of the amplifier is coupled to the first switch so that selectively making contact with one of the taps couples the selected tap to the output terminal of the amplifier.

17 Claims, 5 Drawing Sheets

WIDE RATIO AUTOTRANSFORMER-TYPE CURRENT RANGING

CROSS-REFERENCE TO RELATED APPLICATIONS

This application is a U.S. national counterpart application of international application serial no. PCT/US01/42116 filed Sep. 11, 2001, which claims priority to U.S. provisional application Ser. No. 60/232,719 filed Sep. 15, 2000.

FIELD OF THE INVENTION

This invention relates to transformers. It is disclosed in the context of a precision current transformer, or current ranging transformer. However, it is believed to be useful in other applications as well.

BACKGROUND OF THE INVENTION

Current transformers are used to multiply or divide currents precisely for measurement or calibration. Current rangers are current transformer which have multiple taps on their windings to provide multiple turns ratios in a single device. Current rangers usually include two electrically isolated, magnetically coupled windings, typically referred to as a primary winding and a secondary winding. Either or both of these winding may have multiple taps.

DISCLOSURE OF THE INVENTION

According to one aspect of the invention, a transformer circuit includes a winding having a pair of terminals and taps by which electrical contact can be made to the winding at locations between the terminals along its length. A first switch permits contact to be made selectively to a selected one of the taps. A second switch permits contact to be made selectively to a selected one of the taps. An amplifier has an inverting (−) input terminal, a non-inverting (+) input terminal and an output terminal. The + and − input terminals are coupled across the pair of terminals of the winding. The output terminal of the amplifier is coupled to one of the first and second switches so that selectively making contact with one of the taps couples the selected tap to the output terminal of the amplifier.

Additionally illustratively according to this aspect of the invention, the taps are spaced integral numbers of coils of the winding apart along the winding, thereby permitting integral ratios of coils to be selected by selective actuation of the first switch and the second switch.

Illustratively according to this aspect of the invention, the taps are so spaced along the winding that integral ratios of coils are selected by selective actuation of the first switch and the second switch.

According to another aspect of the invention, a transformer circuit includes a winding having a pair of terminals and taps by which electrical contact can be made to the winding at locations between the terminals along its length. The circuit further includes a switch for selectively making contact to a selected one of the taps, and an amplifier having − and + input terminals and an output terminal. One of the + and − input terminals is coupled to one of the terminals of the winding. The other of the + and − input terminals is coupled to the output terminal of the amplifier.

Illustratively according to this aspect of the invention, the + terminal of the amplifier is coupled to the said one of the terminals of the winding and the − input terminal is coupled to the output terminal of the amplifier.

Further illustratively according to this aspect of the invention, the taps are spaced integral numbers of coils of the winding apart along the winding, thereby permitting integral ratios of coils to be selected by selective actuation of the switch.

Additionally illustratively according to this aspect of the invention, the taps are so spaced along the winding that integral ratios of coils are selected by selective actuation of the switch.

Illustratively according to this aspect of the invention, the apparatus further includes a source. Selective actuation of the switch selectively couples the source to said one of the taps.

Illustratively according to these aspects of the invention, the apparatus further includes two, two-terminal power supplies. Opposite polarity terminals of the two power supplies are joined. The remaining two terminals of the two power supplies being coupled to the amplifier to provide operating potential to it.

Further illustratively according to these aspects of the invention, the apparatus includes a load. One terminal of the load is coupled to the joined terminals of the power supplies. Another terminal of the load is coupled to one of the terminals of the winding.

Additionally illustratively according to these aspects of the invention, the winding is the winding of an autotransformer.

According to another aspect of the invention, a transformer has first and second windings having a turns ratio 1:n. The first winding has a first resistance $R_1$. The second winding has a second resistance $R_2$. At least one of the first and second windings is a multilayer winding. The first winding and the second winding are configured so that one of the ratio $R_1:R_2$ and the ratio $R_2:R_1$ is substantially identical to the ratio 1:n.

Illustratively according to this aspect of the invention, both the first and second windings are multilayer windings.

Further illustratively according to this aspect of the invention, the transformer is an autotransformer.

BRIEF DESCRIPTION OF THE DRAWINGS

The invention may best be understood by referring to the following detailed description and accompanying drawings which illustrate the invention. In the drawings.

DETAILED DESCRIPTIONS OF ILLUSTRATIVE EMBODIMENTS

Figure 1:
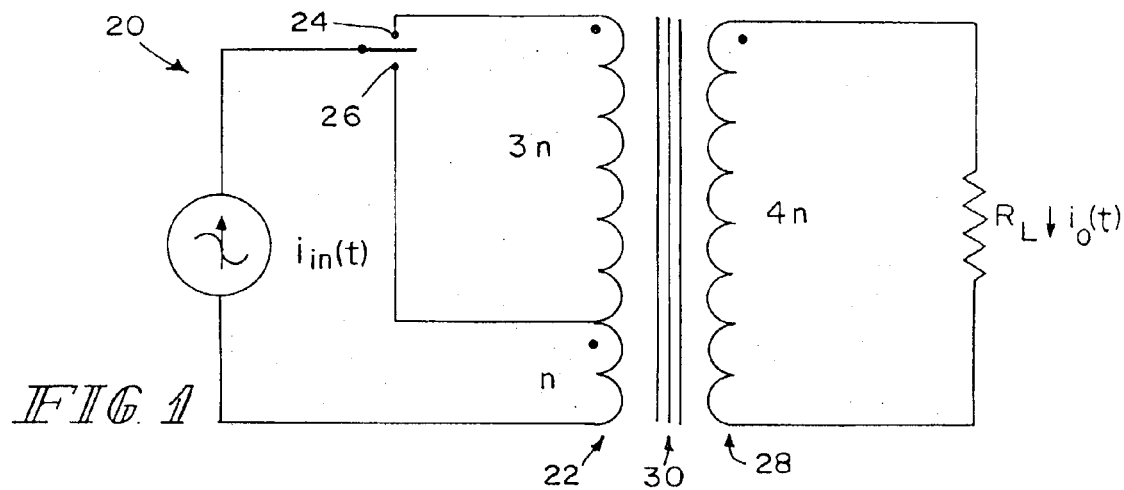
FIGS. 1–11 illustrate schematic circuit diagrams useful in understanding the invention.

A simplified, ideal current ranger 20 is illustrated schematically in FIG. 1. Current ranger 20 is illustrated as a step-down transformer with a primary, input winding 22 having two taps 24, 26 and a secondary, output winding 28 having no taps. In the illustrated configuration, the ranger 20 is either a one-to-one or a four-to-one step-down transformer, depending upon which of the two taps 24, 26 is chosen. At tap 24 the secondary 28 has the same number of turns as the primary winding 22. This produces an output current $i_o(t)$ equal to the input current, $i_{in}(t)$. At tap 26 the secondary winding 28 has four times the number of turns of the primary 22. This produces an output current, $i_o(t)$, which is one-fourth the input current, $i_{in}(t)$. Many other configurations, both step-up and step-down, with many more taps and ratios are, of course, possible.

The basics of transformer functions are quite well known. The underlying object is to have zero flux in the transformer 20 at all times. The value of the load resistor, $R_L$, is ideally zero ohms. This shorted secondary winding 28 will thus have zero volts across it at all times. Since the voltage across winding 28 is constrained to be zero volts, there can be no change in flux in the core 30 of the transformer 20. Since the core 30 initially had no flux and no change in flux can occur, the flux in the core 30 remains at zero. Since the primary 22 and secondary 28 windings share a common flux path through core 30, there can be no change in the flux in the primary 22 either. The $i_{in}(t)$ current source coupled to the primary 22 requires that the current $i_{in}(t)$ flow in the primary winding 22. This means that, depending upon which tap is selected, there are either $n \times i_{in}(t)$ ampere-turns or $4n \times i_{in}(t)$ ampere-turns of current flowing in the primary 22. In order for the flux to be at zero, there must be an equivalent number of ampere-turns in the secondary 28 cancelling the field that the current $i_{in}(t)$ through the primary 22 is producing. In the illustrated example, when the load $R_L$ is driven from tap 26, there are n turns in the primary 24 and 4n turns in the secondary 28. This means that $i_o(t)$ must equal ¼ of $i_{in}(t)$ for the number of ampere-turns in each coil 22, 28 to be equal but opposite. In the general case, the current flow in the secondary winding 28 is directly proportional to the input current $i_{in}(t)$ and inversely proportional to the ratio of secondary 28 turns divided by primary 22 turns.

There are, of course, no ideal transformers 20, current sources $i_{in}(t)$ or loads $R_L$. The practical current source always has some finite output impedance. Loads $R_L$ are always greater than zero ohms. The core 30's finite permeability and non-zero loss characteristics give rise to magnetization currents and core 30 loss. Windings 22, 30 have non-zero resistances.

Figure 2:
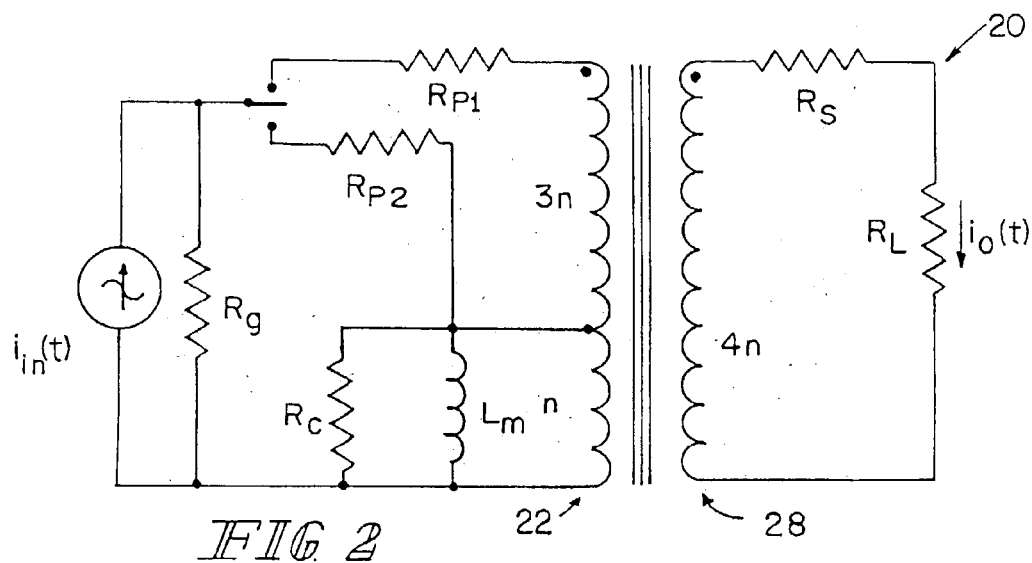

A schematic of a typical non-ideal current transformer coupled to a non-ideal current source and load is illustrated in FIG. 2. An idealized current source $i_{in}(t)$ and transformer 20 are illustrated with parasitic components to approximate the typical non-ideal case. The resistors $R_{p1}$, $R_{p2}$ and $R_s$ represent the primary and secondary winding resistances. The resistor $R_c$ represents the core loss. The inductor $L_m$ represents the magnetizing current of the transformer 20. The resistor $R_L$ represents the load resistance. The resistor $R_g$ represents the realizable source impedance associated with current source $i_{in}(t)$.

By use of known techniques, the magnetizing inductance, $L_m$, and core loss, $R_c$, can be reduced to relatively insignificant levels. Further, electronic compensation of the core can reduce these effects even further. This invention is directed toward reduction of the effects of $R_L$, $R_{p1}$, $R_{p2}$ and $R_s$.

Although current rangers 20 have traditionally been provided with two isolated windings 22, 28, in many cases, there is no real need for this isolation. In fact, the isolation function provided by providing the ranger 20 with isolated windings 22, 28 is redundant in the system and may exist for other reasons than a need for isolation per se. Sometimes isolated windings 22, 28 are used because techniques which employ isolated windings 22, 28 are well-known. Sometimes it is easier to understand the function of the transformer 20 if it is thought of as having two isolated windings 22, 28. Other times, isolation may have been provided because of the needs of some other electronic circuitry.

Figure 3:
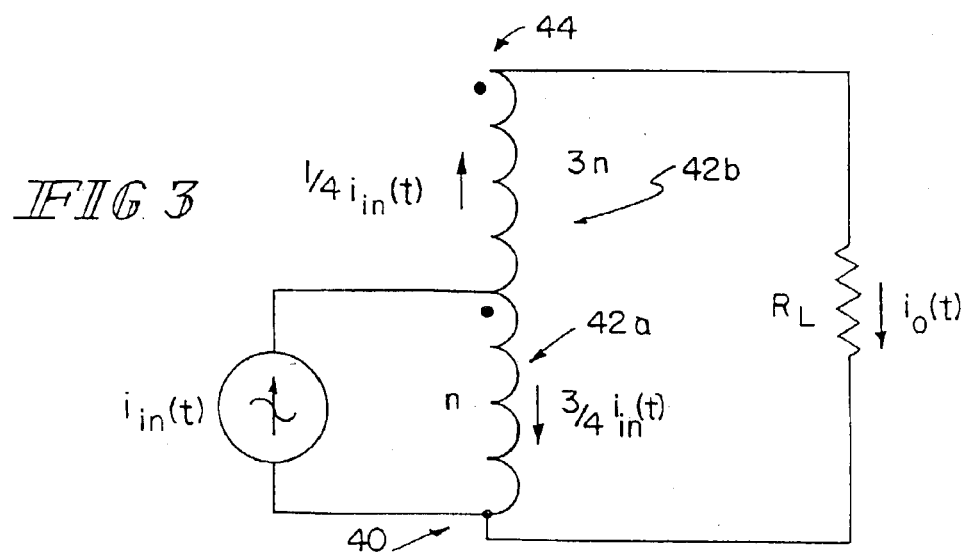

Once a situation is identified in which isolation between primary 22 and secondary 28 is not required, other approaches which permit reduction of the winding resistances $R_p$, $R_{s1}$ and $R_{s2}$ can be pursued. One solution is to use an autotransformer. Autotransformers permit more efficient transformer structures by combining the primary 22 and secondary 28 windings into a single winding. Autotransformers supply many of the same electrical and magnetic functions as transformers having electrically isolated primary and secondary windings, except, of course, electrical isolation of the primary from the secondary. The capability of autotransformers to function as current transformers is illustrated beginning at FIG. 3. FIG. 3 illustrates an ideal four-to-one step-down transformer 40. (For clarity, the transformer cores have been omitted from the illustrations that follow.) Again, any practical turns ratio is achievable. For the purpose of illustration, the transformer 40 is idealized. For example, permeability of the core 44 is assumed to be infinite, and the core loss is assumed to be zero. Winding resistance is also assumed to be zero.

As in the earlier analysis of the isolated 22, 28 transformer 20, a shorted load ($R_L$=0) keeps the voltage across the winding 42 at zero at all times. Since the voltage across winding 42 is always constrained to zero volts, there can be no change in flux in the core 44. Since the core 44 initially had no flux and no change in flux could take place, the flux in the core 44 remains zero. The current source, however, requires that the current flow $i_{in}(t)$ into the junction of the n turn lower section 42a of the winding 42 and 3n turn upper section 42b of the winding 42. In order for the flux in the core 44 to remain at zero, the current from the current source must divide such that the ampere turns created by the two sections 42a, 42b of the winding 42 in the autotransformer 40 neutralize each other. Since section 42b of winding 42 has three times the turns of section 42a, the current must divide such that ¾ of the current of $i_{in}(t)$ flows into section 42a of winding 42 and ¼ of the current flows into section 42b of winding 42. This provides ¾ $i_{in}(t) \times n$ ampere-turns flowing in each of sections 42a, 42b, but in opposite directions. Since the current in section 42b of winding 42 is ¼ $i_{in}(t)$ and this is also the output current, $i_o(t)$, autotransformer 40 is a four-to-one step-down transformer.

Figure 4:
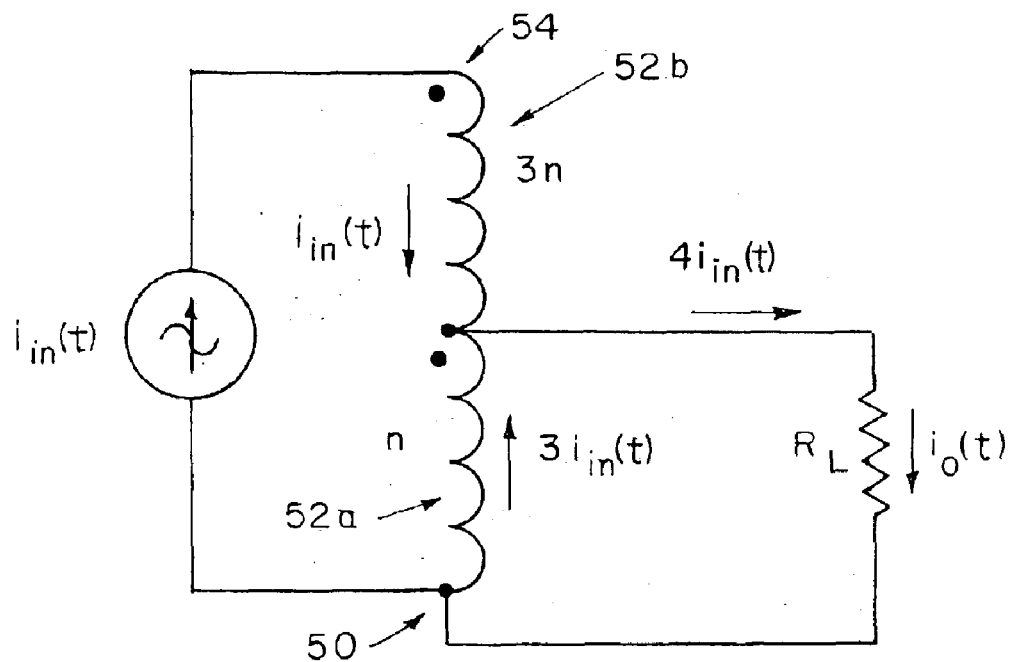

A similar analysis can be performed for a step-up current autotransformer configuration. Such a configuration is illustrated in FIG. 4. As with the embodiment of FIG. 3, for the purpose of explanation, the transformer 50 is considered ideal. Permeability of the core 54 is infinite and the core loss is zero. Winding 52 resistance is zero. The load resistor $R_L$ is also assumed to be zero (a short circuit).

As in the step-down case, since the voltage across the n turn winding 52a is always constrained to be zero volts by the shorted output terminals ($R_L$=0), there can be no change in flux in the core 54. Since the core 54 initially had no flux and no change in flux could take place, the flux in the core 54 remains at zero. By design the 3n and n turn sections 52b, 52a, respectively, of the windings 52 share the same flux path. The current source, however, requires that a current of $i_{in}(t)$ flow into the 3n turn upper winding 52b. In order for the flux in the core 54 to remain at zero, the currents in sections 52a, 52b of the winding 52 must be such that the ampere turns created by these two sections 52a, 52b of the winding 52 neutralize each other. Since there are $3n \times i_{in}(t)$ ampere-turns in section 52b there must be a current of $3i_{in}(t)$ in the n turn coil section 52a. The current into the load $R_L$ is the sum of the currents in the n and 3n turn coil sections 52b, 52a, respectively, and therefore equals $4i_{in}(t)$. A four-to-one step-up transformer has been realized with autotransformer 50.

For the general case, the current flow in the output is directly proportional to the input current and inversely proportional to the ratio of the number of turns of the winding which drive the load divided by the number of turns of the winding driven by the input current source. It has thus been demonstrated that autotransformers are effective in realizing current transformers and current rangers. There are at least two significant advantages of the autotransformer configuration in a current transformer over the isolated winding configuration. First, winding resistance for equivalent winding area is reduced. This aids significantly in keeping burden of the transformer low. Second, the transformer has a somewhat simpler and less costly construction.

Figure 5:
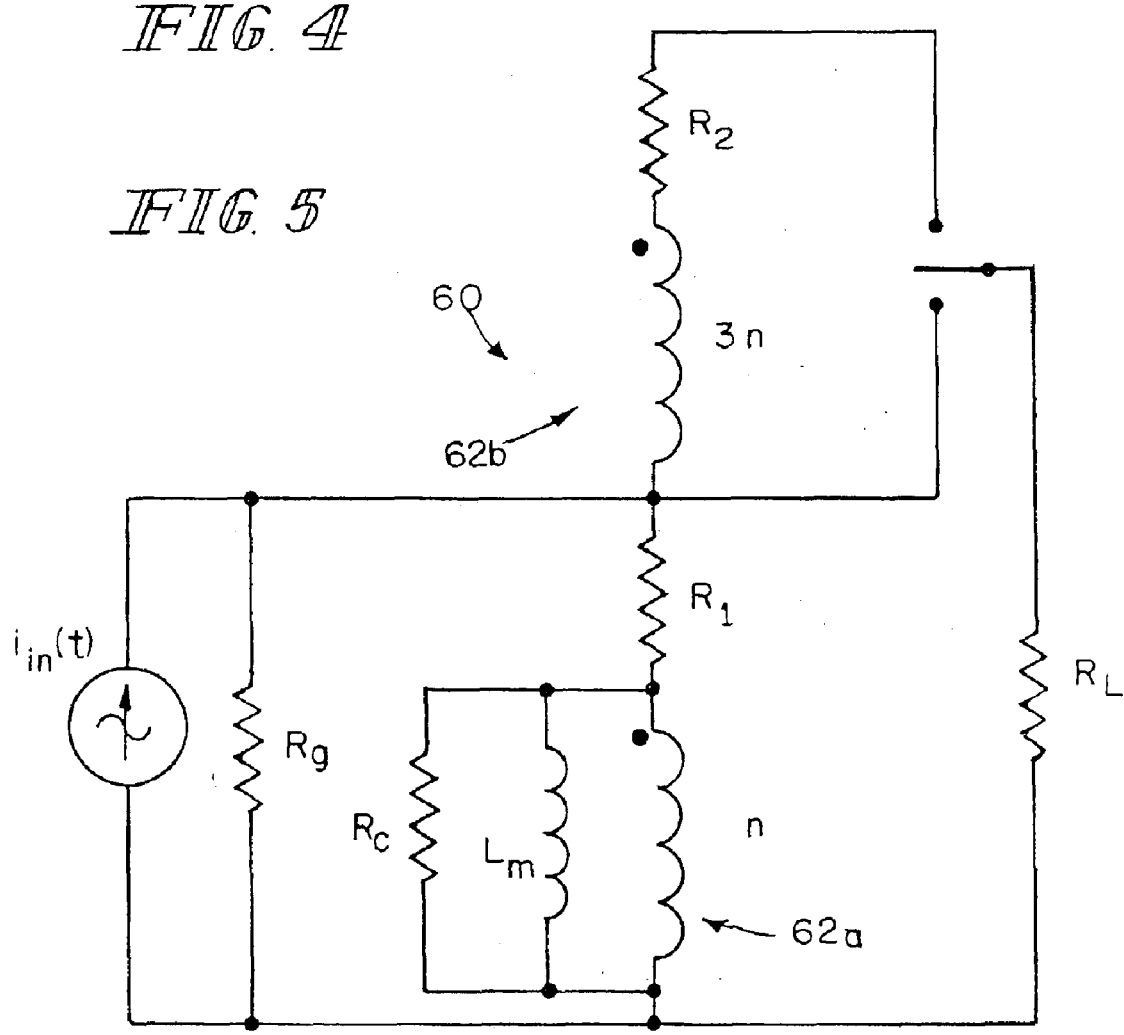

Practical aspects of using an autotransformer as a current transformer can be considered with reference to FIG. 5. FIG. 5 illustrates a schematic diagram of a practical step-down current ranger using an autotransformer. As with the above examples, current ranger autotransformer 60 is illustrated as a one-to-one and a four-to-one step-down transformer. Other ratios and other numbers of taps are clearly available, and do not impact the availability of autotransformers as current transformers.

An idealized current source and transformer are illustrated with parasitic components to approximate a non-ideal transformer. The ideal transformer 60 is the transformer formed by the 3n turn and n turn windings 62b and 62a. The resistors $R_1$ and $R_2$ represent the resistances associated with the 3n turn and n turn winding sections 62b and 62a. The resistor $R_1$ represents the core loss. The inductor $L_m$ represents the magnetizing current of the autotransformer 60. The resistor $R_L$ represents the load resistance. The resistor $R_g$ represents the source impedance of the non-ideal current source $i_{in}(t)$.

One way to reduce the effects of resistors $R_c$, $R_1$ and $R_2$ is to reduce the size of the core. As the volume of the core decreases, the core losses decrease, and the effective value of $R_c$ increases. As the core size decreases, the mean length per turn of the windings 62 also decreases. The winding resistances $R_1$ and $R_2$ decrease as direct results of the decrease in the mean length per turn of the windings 62. Further, as the core size decreases, transformer cost usually decreases. However, as core size decreases, the value of the magnetizing inductance $L_m$ also decreases. The presence of $L_m$ permits current to flow in (a) section(s) 62a, 62b of the autotransformer 60 that are not counterbalanced by ampere-turns of current flow in the other section(s) 62b, 62a of the windings 62. The transformer action is thus bypassed. The values of the parasitic elements determine the magnitude(s) of this (these) current flow(s). This results in errors in the current ratios in the different sections 62a, 62b of the autotransformer 60. Reducing the value of $L_m$ increases this effect. Even with electronic compensation, it may be difficult to make the value of $L_m$ high enough to render the unbalanced current error negligible for the accuracy desired.

A solution to this problem can best be understood by considering the limiting case in which $L_m$ has become so low that it is effectively shorting the ideal transformer 60 which is formed by the 3n and n turn windings 62b, 62a in FIG. 5. For this example, the four-to-one step-down tap is considered, the one-to-one case being straightforward. This effectively provides a resistive divider formed by resistors $R_g$, $R_1$, $R_2$ and $R_L$. These resistors steer the current from the current source. Since resistor $R_g$ is normally much, much larger than $R_1$, $R_2$, and $R_L$, and since it only affects the error of the non-ideal current source $i_{in}(t)$, and not the transformer 60, $R_g$ can be ignored for the purposes of this analysis.

Figure 6:
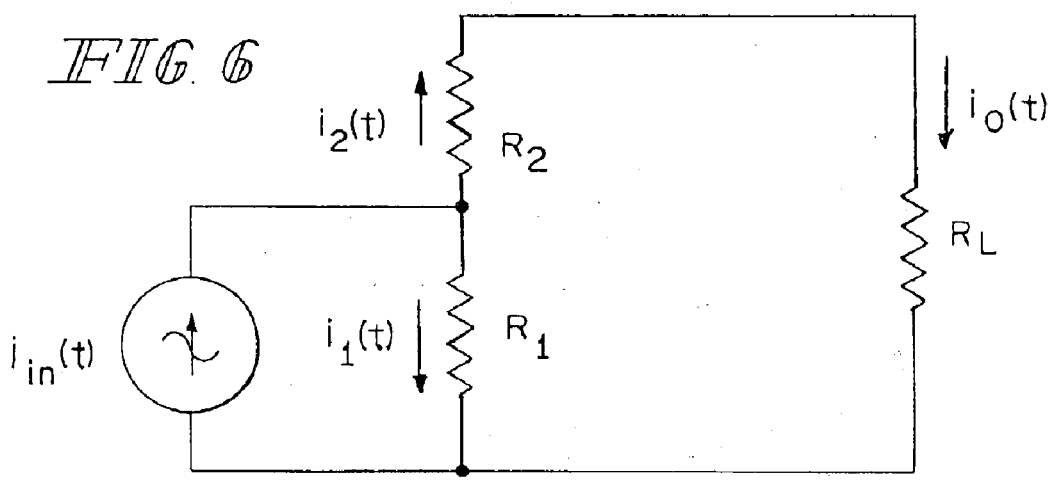

The simplified circuit is illustrated in FIG. 6. Analyzing this circuit, the current $i_{in}(t)$ divides so that $i_2(t)=i_{in}(t)\times(R_1)/(R_1+R_2+R_L)$. The current $i_2(t)$ equals the output current $i_o(t)$. If the load resistance $R_L$ is zero ohms (or negligible when compared to $R_1+R_2$), then the above equation for $i_2(t)$ may be written as $i_o(t)=i_{in}(t)\times(R_1)/(R_1+R_2)$. Thus, the output current $i_o(t)$ is proportional to the input current $i_{in}(t)$ and inversely proportional to the ratio of the resistance encompassed by the output load, $R_1+R_2$, divided by the resistance encompassed by the input current source, $R_1$. This is very similar to the current division produced by the autotransformer 60 itself. If the values of $R_1$ and $R_2$ are arranged to be proportional to the number of turns in each coil section 62a, 62b, then the current division caused by the winding resistances' resistive divider exactly matches the current division caused by the autotransformer 60's action. Were it not for the build that occurs when winding coils, this proportional nature would occur automatically when the same type and gauge wire is used throughout the windings 62. With slight adjustments in wire gauge and/or additional non-inductive resistance tuning at the ends of the windings, the above resistance ratios can be matched to almost any desired level of precision.

Thus, by balancing winding resistances, the effect of the loss in accuracy caused by the presence of the parasitic inductance $L_m$ can be substantially reduced. The parasitic winding resistances have been arranged to provide the same current division as that provided by the transformer 60's action. Thus, the autotransformer 60 tends to maintain its accuracy without regard to variation in the value of $L_m$, whether resulting from shrinking core size, changing drive frequency, or whatever other source. If the resistances can be perfectly balanced, there is no error, even at DC. By making the winding resistances proportional to their turns, more accurate step-down autotransformers can be constructed with less material and thus less cost.

Figure 7:
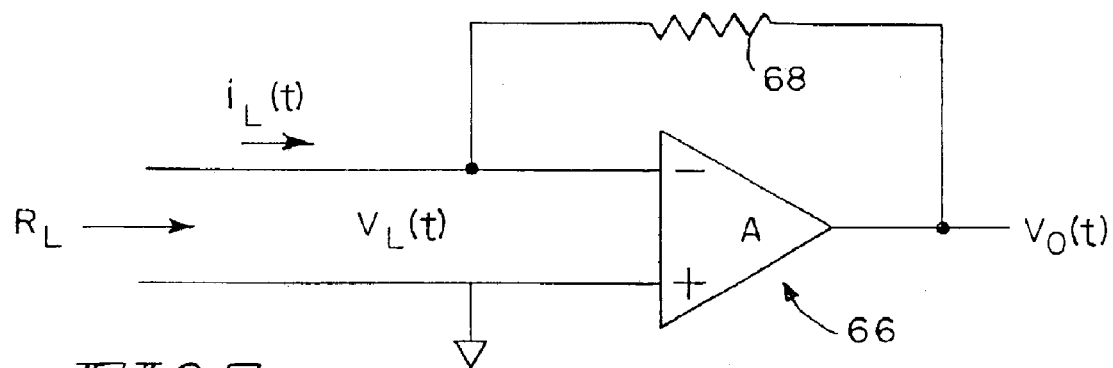

One of the underlying assumptions of the above impedance-balancing scheme is that $R_L$ be negligible when compared to $R_2$. Because considerable effort is expended to make $R_2$ as small as possible, $R_L$ must be made very close to zero for this assumption, and the circuit analysis based upon it, to hold. One method for making $R_L$ approach zero is to use the virtual ground characteristics of an operational amplifier (hereinafter sometimes op-amp) to make $R_L$ approach zero ohms. This approach is illustrated in FIG. 7. Here the non-inverting (+) input terminal of an op-amp 66 is one terminal of $R_L$ and the inverting (−) input terminal of op-amp 66 is the other terminal of $R_L$. Although not required, in this circuit, the + input terminal of op-amp 66 is coupled to ground to help prevent the common mode range of op-amp 66 from being exceeded. Typically, this does not cause any problems in the rest of the circuit. A resistor 68 is coupled from the output terminal of op-amp 66 to its − input terminal.

The output voltage of op-amp 66 varies in such a way that any current at its − input terminal passes through resistor 68. Op-amp 66 performs a current-to-voltage conversion. The output voltage of op-amp 66 is roughly equal to the current at its − input terminal times the value of resistor 68. If op-amp 66 has infinite gain, no voltage appears across its + and − input terminals, and the load impedance $R_L$ is zero. If op-amp 66 has a finite gain A, then the output voltage divided by the op-amp gain A appears across the + and − input terminals. Since $v_o(t)$ is $i_L(t)\times R_{68}$, the voltage across the input, $v_L$, is $\{i_L(t)\times R_{68}\}/A$. The impedance $R_L$ is $v_L(t)/i_L(t)$. Consequently; $R_L$ is $R_{68}/A$. Although this circuit works well, it is difficult to couple to the next stage. If the next stage requires a current input, that next stage must ether be floating or a voltage-to-current conversion must be performed. A floating input is sometimes difficult to achieve. A satisfactory current-to-voltage-to-current conversion is also sometimes difficult to achieve.

Figure 8:
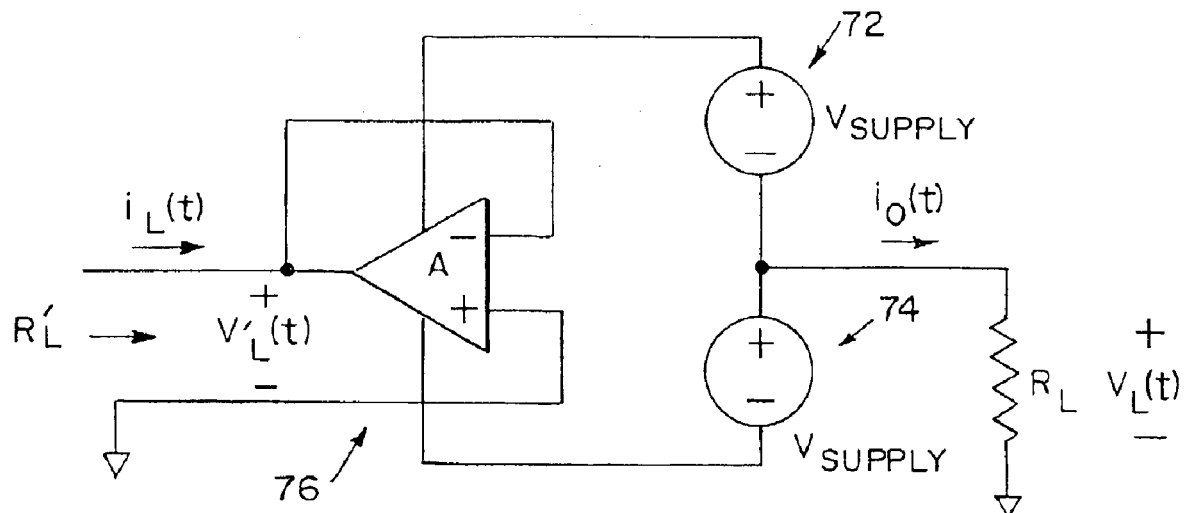

An improved circuit is illustrated in FIG. 8. The circuit illustrated in FIG. 8 reduces to zero the resistance of the feedback resistor 68. The circuit of FIG. 8 also adds two floating, two-terminal operating voltage supplies 72, 74 for op-amp 76, for reasons that will become clear. The circuit illustrated in FIG. 8 makes use of the virtual ground of the op-amp 76 to provide an essentially zero ohm load, but avoids the need for a current-to-voltage conversion. This circuit presents substantially zero ohms as its effective impedance $R_L'$, but outputs a current $i_o(t)$ which is nearly independent of the value of the load resistor $R_L$.

The op-amp 76 attempts to keep the voltage difference across its + and − input terminals at zero. Since no current can flow into the + or − input terminals of op-amp 76, the current $i_L(t)$ must flow into the output terminal of op-amp 76. Because the power supplies 72, 74 are floating, that is, coupled only to the op-amp 76, the current into the output of op-amp 76 goes through the op-amp 76, out through the power supply terminals of op-amp 76, through the floating supplies 72, 74, and into the load resistor $R_L$ of the circuit as $i_o(t)$. Additional circulating current flows through the power supplies 72, 74 and op-amp 76 in order to power the op-amp 76, but it cannot leave the loop.

The effectiveness of the circuit illustrated in FIG. 8 is somewhat harder to evaluate than the circuit illustrated in FIG. 7. Error from the finite gain A of the op-amp 76 and the finite common mode rejection of the op-amp 76 appear as voltage at $v_L'(t)$. To find the error from the finite gain, A, the output voltage of the op-amp 76 must first be determined. The output voltage, $v_L'(t)$, of the op-amp 76 is the difference between the voltage at the output terminal of op-amp 76 and the ground of the power supplies 72, 74 of op-amp 76. Because the power supplies 72, 74 are floating on top of $R_L$, the output voltage of op-amp 76 is the difference between the voltage, $v_L(t)$, across $R_L$ and the output $v_L'(t)$ of the op-amp 76. As $v_L'(t)$ is much, much smaller-than $v_L(t)$, $v_L(t)$ will be used throughout the remainder of this analysis as the output voltage of the op-amp 76. This voltage divided by the op-amp gain, A, appears across the input terminals of the op amp 76.

The common mode rejection of the op-amp 76 also contributes to the output voltage of the op-amp 76. Because the + and − input terminals of op-amp 76 remain at ground potential, and the supplies move with $v_L(t)$, the + and − inputs see a common mode voltage equal to $v_L(t)$. From the definition of the common mode rejection ratio G, the common mode voltage divided by the common mode rejection ratio, G, also appears across the + and − input terminals. As noted, the voltage $v_L(t)$ is the common mode voltage and that this voltage divided by the common mode rejection ratio, G, appears across the + and − input terminals of the op-amp 76.

The total voltage across the + and − input terminals of the op-amp 76 is thus the sum of the common mode rejection error voltage, $v_L(t)/G$ and the gain error voltage, $v_L(t)/A$. Thus $v_L'(t) = \{(i_o(t) \times R_L)/A\} + \{(i_o(t) \times R_L)/G\}$. Recognizing that $i_o(t)$ is equal to $i_L(t)$ and rearranging terms yields $v_L'(t) = \{(A+G) \times i_L(t) \times R_L\}/AG$. Since $R_L'$ is $v_L'/i_L(t)$, the effective impedance $R_L'$ of the circuit is $\{(A+G) \times R_L\}/AG$. Where A and G are very large, as they tend to be in an op-amp, and $R_L$ is small, as it usually is by design, the impedance $R_L'$ is quite small.

The circuit illustrated in FIG. 8 thus improves upon the performance of the circuit illustrated in FIG. 7, first in the magnitude of the load impedance it presents, and second in that it does not require the next stage to have a floating input, nor does it require a current-to-voltage-to-current conversion.

Figure 9:
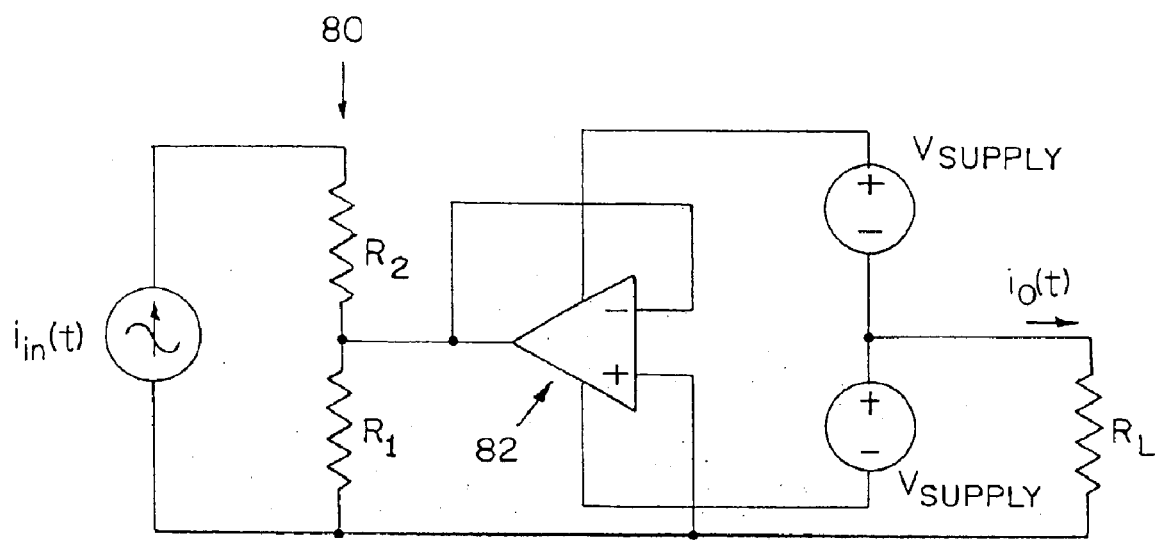

The resistance-balancing method for compensating for changes in parasitic inductance $L_m$ discussed above does not work with step-up autotransformers in which the load is a short. This is illustrated in FIG. 9. FIG. 9 illustrates the limiting case in which $L_m$ has shorted out the transformer 80 and current is being steered by the parasitic winding resistances $R_1$ and $R_2$. The op-amp current buffer 82 as described in connection with FIG. 8 has been incorporated into this model. As can be seen, the current from the current source passes through $R_2$ and then directly into the output of the current buffer 82. Because the current buffer 82 has substantially zero ohms output impedance, even when compared to the typically quite low resistance of $R_1$, no current flows through $R_1$. There is, however, a variation on this circuit that will constitute $R_1$ and $R_2$ a current divider that mirrors the current divider formed by the autotransformer winding. This variation is illustrated in FIG. 10.

Figure 10:
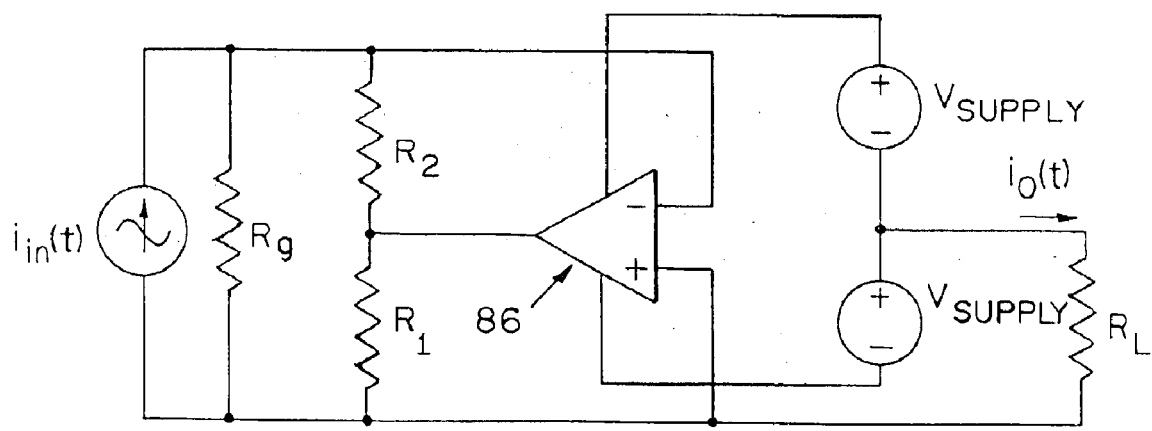

Referring to FIG. 10, the negative feedback to the op-amp 86 has been moved from the output of the op-amp 86 to the node at which $R_2$ is coupled to the current source $i_{in}(t)$. The source impedance $R_g$ for the non-ideal current source $i_{in}(t)$ has been added back to the model for reasons which will become clear. Moving the negative feedback to the op-amp 86 to the node at which $R_2$ is coupled to the current source $i_{in}(t)$ changes the manner in which voltage is applied to resistors $R_1$ and $R_2$. In this configuration, op-amp 86 adjusts the voltage applied at its output to keep the voltage at the node at which $R_2$ is coupled to the current source $i_{in}(t)$ the same as the voltage at the node at which $R_1$ is coupled to the current source $i_{in}(t)$. Since $i_{in}(t)$ must flow through $R_2$, the voltage across $R_2$ must be $i_{in}(t) \times R_2$. Because the node at which $R_1$ is coupled to the current source $i_{in}(t)$ is at the same potential as the node at which $R_2$ is coupled to the current source $i_{in}(t)$ and the remaining terminals of $R_1$ and $R_2$ are joined, $R_1$ and $R_2$ have equal and opposite potentials across them. This means that the ratio of the current through $R_1$ to the current through $R_2$ is the same as the ratio of the resistance of $R_2$ to the resistance of $R_1$. If resistor $R_2$ has three times the resistance of resistor $R_1$, then three times the current must flow through $R_1$ as flows through $R_2$. Since the polarity is reversed, both currents flow into or out of the same node. This means that the current which goes into or out of the node must be $i_{in}(t) + 3i_{in}(t) = 4i_{in}(t)$. Since this current has nowhere else to go, it goes into, or comes out of, the output of op-am 86, but the output current of op-amp 86 is $i_{in}(t)$. This is exactly the step-up action exhibited by an autotransformer. Thus, the concept of resistance balance extends to step-up autotransformers.

Another benefit of relocating the feedback winding to the common node of $R_2$ and the current source $i_{in}(t)$ is that the entire load of the winding resistances is supplied by the op-amp 86. The voltage seen by the current source $i_{in}(t)$ is zero. This means that the current source $i_{in}(t)$ is working into a short and no error current flows in $R_g$. This eliminates another source of error. Finally, because the voltage across the autotransformer is clamped at zero volts, there is no flux in the core of the autotransformer.

Figure 11:
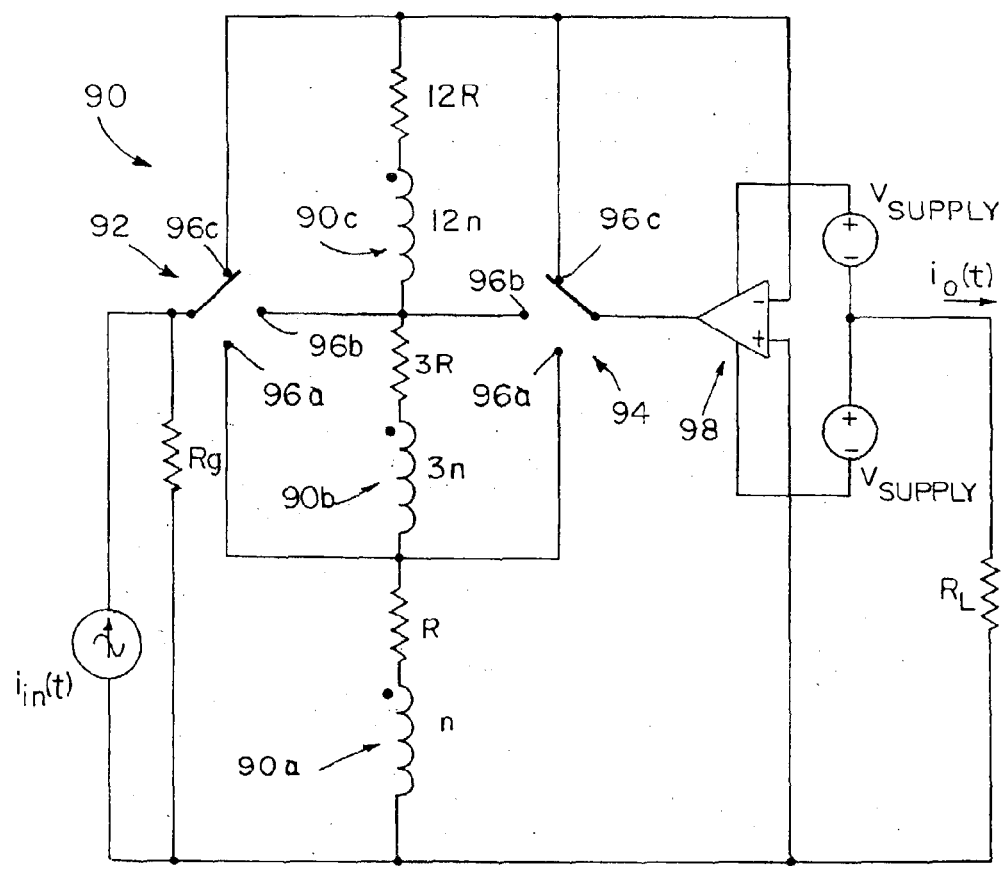

Both step-up and step-down transformers can be combined in a switching arrangement that creates an autotransformer providing both step-up and step-down capabilities. Such an arrangement provides a wide range of ratios. Such a realization is illustrated in FIG. 11. A three-section current ranger 90 provides windings 90a, 90b, 90c with ratios $90a:(90a+90b)$, $(90a+90b):(90a+90b+90c)$ in multiples of 4. (The windings' parasitic resistances are illustrated.) Such a current ranger can, of course, be designed with any desired step sizes and any number of winding sections. Two switches 92, 94 are provided for selecting the taps. Switch 94 selects the tap 96a, 96b, 96c used by the load $R_L$ as reflected at the output terminal of op-amp 98, and switch 92 selects the tap 96a, 96b, 96c used by the input $i_{in}(t)$. The ratios that can be achieved in this specific example are illustrated in the following table.

| Output Input | T3 | T2 | T1 |
|---|---|---|---|
| T6 | 1:1 | 1:4 | 1:16 |
| T5 | 4:1 | 1:1 | 1:4 |
| T4 | 16:1 | 4:1 | 1:1 |

As can be seen from the table if there are n taps, there are $n^2$ unique settings. There are not, however, $n^2$ unique ratios. Many of the ratios are duplicated. In the illustrated embodiment, there are three ways of achieving the 1:1 ratio, two ways of achieving the 4:1 ratio, and two ways of achieving the 1:4 ratio. There are five unique ratios. This is a significant improvement over prior art current rangers, because without the step-up, step-down technique two additional windings would have had to be added to a current ranger to achieve five ratios. Adding the required switching is far less expensive than adding the two more windings to a prior art current ranger.

From a study the table, an understanding can be developed of how many unique ratios are possible for any number of taps. The unique ratios appear in the outside columns of the table. If the table is square and size n, there are n unique ratios along one outside column of the table, and n−1 unique ratios on the other outside column. This predicts the availability of 2n−1 ratios from an autotransformer that has n taps. The invention thus makes available more current ranges with fewer taps.

What is claimed is:

1. A transformer circuit including a winding having a pair of terminals and taps by which electrical contact can be made to the winding at locations between the terminals along its length, a first switch for selectively making contact to a selected one of the taps, a second switch for making contact to a selected one of the taps, an amplifier having an inverting (−) input terminal, a non-inverting (+) input terminal and an output terminal, the + and − input terminals coupled across the pair of terminals of the winding, and the output terminal of the amplifier coupled to one of the first and second switches so that selectively making contact with one of the taps couples the selected tap to the output terminal of the amplifier.

2. The apparatus of claim 1 further including two, two-terminal power supplies, opposite terminals of the two power supplies being joined, and the remaining two terminals of the two power supplies being coupled to the amplifier to provide operating potential to it.

3. The apparatus of claim 2 further including a load, one terminal of the load coupled to the joined terminals of the power supplies and another terminal of the load coupled to one of the terminals of the winding.

4. The apparatus of claim 1 wherein the taps are spaced integral numbers of coils of the winding apart along the winding, thereby permitting integral ratios of coils to be selected by selective actuation of the first switch and the second switch.

5. The apparatus of claim 1 wherein the taps are so spaced along the winding that integral ratios of coils are selected by selective actuation of the first switch and the second switch.

6. The apparatus of claim 1 wherein the winding is the winding of an autotransformer.

7. A transformer circuit including a winding having a pair of terminals and taps by which electrical contact can be made to the winding at locations between the terminals along its length, a switch for selectively making contact to a selected one of the taps, an amplifier having an inverting (−) input terminal, a non-inverting (+) input terminal and an output terminal, one of the + and − input terminals coupled to one of the terminals of the winding, and the other of the + and − input terminals coupled to the output terminal of the amplifier.

8. The apparatus of claim 7 wherein the + terminal of the amplifier is coupled to said one of the terminals of the winding and the − input terminal is coupled to the output terminal of the amplifier.

9. The apparatus of claim 7 further including two, two-terminal power supplies, opposite terminals of the two power supplies being joined, and the remaining two terminals of the two power supplies being coupled to the amplifier to provide operating potential to it.

10. The apparatus of claim 9 further including a load, one terminal of the load coupled to the joined terminals of the power supplies and another terminal of the load coupled to one of the terminals of the winding.

11. The apparatus of claim 7 wherein the taps are spaced integral numbers of coils of the winding apart along the winding, thereby permitting integral ratios of coils to be selected by selective actuation of the switch.

12. The apparatus of claim 7 wherein the taps are so spaced along the winding that integral ratios of coils are selected by selective actuation of the switch.

13. The apparatus of claim 7 wherein the winding is the winding of an autotransformer.

14. The apparatus of claim 7 further including a source, selective actuation of the switch selectively coupling the source to said one of the taps.

15. A transformer having first and second windings having a turns ratio 1:n, the first winding having a first resistance $R_1$, the second winding having a second resistance $R_2$, at least one of the first and second windings being a multilayer winding, the first winding and the second winding being configured so that one of the ratio $R_1:R_2$ and the ratio $R_2:R_1$ is substantially identical to the ratio 1:n.

16. The apparatus of claim 15 wherein both the first and second windings are multilayer windings.

17. The apparatus of claim 15 wherein the transformer is an autotransformer.

\* \* \* \* \*